(12) United States Patent
Song

(10) Patent No.: US 7,453,191 B1
(45) Date of Patent: Nov. 18, 2008

(54) INDUCTION CONCENTRATION REMOTE ATMOSPHERIC PRESSURE PLASMA GENERATING APPARATUS

(75) Inventor: Seok Kyun Song, Seoul (KR)

(73) Assignee: UION Co., Ltd., Seoul (KR)

( * ) Notice: Subject to any disclaimer, the term of this patent is extended or adjusted under 35 U.S.C. 154(b) by 0 days.

(21) Appl. No.: 11/774,100

(22) Filed: Jul. 6, 2007

(51) Int. Cl.
*H01J 17/26* (2006.01)
*H01J 7/24* (2006.01)

(52) U.S. Cl. .............................. 313/231.31; 315/111.21

(58) Field of Classification Search ............ 315/111.01, 315/111.11, 111.21, 111.31, 111.41, 111.51; 313/63, 167, 231.01, 231.31, 231.41, 293, 313/306–307
See application file for complete search history.

(56) References Cited

U.S. PATENT DOCUMENTS

| | | | | |
|---|---|---|---|---|
| 4,935,661 A * | 6/1990 | Heinecke et al. | ........ | 313/231.31 |
| 5,369,336 A * | 11/1994 | Koinuma et al. | ........ | 315/111.21 |
| 5,378,957 A * | 1/1995 | Kelly | ..................... | 313/231.01 |
| 5,387,842 A | 2/1995 | Roth et al. | ............. | 315/111.21 |
| 5,414,324 A | 5/1995 | Roth et al. | ............. | 315/111.21 |
| 5,847,494 A * | 12/1998 | Bayliss et al. | .......... | 313/231.31 |
| 6,424,091 B1 | 7/2002 | Sawada et al. | ......... | 315/111.81 |
| 6,774,569 B2 * | 8/2004 | de Vries et al. | ........ | 315/111.21 |
| 2003/0227259 A1 * | 12/2003 | Matsushita | ............. | 315/111.21 |

OTHER PUBLICATIONS

T.Yokoyama, et al., The mechanism of the stabilisation of glow plasma at atmospheric pressure, J. Phys. D: Appl. Phys., 1990, p. 1125-1128, 23, IOP Publishing Ltd., U.K.

* cited by examiner

*Primary Examiner*—Thuy Vinh Tran
*Assistant Examiner*—Tung X Le
(74) *Attorney, Agent, or Firm*—John K. Park; Park Law Firm

(57) ABSTRACT

The present invention relates, in general, to an induction concentration remote atmospheric pressure plasma generating apparatus, and more particularly, to an induction concentration remote atmospheric pressure plasma generating apparatus in which induction electrodes, discharge electrodes and a ground electrode are used, so that a plasma can be generated in a plasma cell including several metal discharge electrodes by using one power supply device while not generating arc between the metal electrodes, and a high-density plasma is generated at local regions due to a discharge between the metal electrodes and is thus spouted to the surface of a sample by means of the pressure of a working gas. Thus, a plasma is not generated in unnecessary regions.

3 Claims, 1 Drawing Sheet

INDUCTION CONCENTRATION REMOTE ATMOSPHERIC PRESSURE PLASMA GENERATING APPARATUS

BACKGROUND OF THE INVENTION

1. Field of the Invention

The present invention relates, in general, to an induction concentration remote (ICR) atmospheric pressure plasma generating apparatus, and more particularly, to an induction concentration remote atmospheric pressure plasma generating apparatus in which high voltage is applied to hot electrodes and in particular induction electrodes are used, so that a plasma can be generated in a plasma cell including several metal discharge electrodes by using one power supply device while not generating arc between metal electrodes, and large area samples can be processed efficiently by generating a high-density plasma.

2. Background of the Related Art

In general, a low-pressure plasma can be easily generated, but requires expensive apparatuses for maintaining a low-pressure state, such as a vacuum chamber and an exhaust device. Further, the low-pressure plasma has a limit to mass-production processing due to the product input method of a batch type. In contrast, the atmospheric pressure plasma can be generated in the state of an atmospheric pressure (760 Torr), and thus does not require an expensive vacuum system. Further, the atmospheric pressure plasma is advantageous in that it enables a consecutive process and mass production.

The most widely used method as a method of generating a plasma while prohibiting arc discharge at an atmospheric pressure is a dielectric material barrier type (T, Yokoyama, M. Kogoma, T. Moriwaki, and S. Okazaki, J. Phys. D: Appl. Phys. V23, p 1125 (1990)), (John R. Roth, Peter P. Tsai, Chaoyu Lin, Mouuir Laroussi, Paul D. Spence, "Steady-state, Glow discharge plasma", U.S. Pat. No. 5,387,842 (Feb. 7, 1995), "One Atmosphere, Uniform Glow discharge plasma", U.S. Pat. No. 5,414,324 (May 9, 1995)).

A general AC barrier type is a method in which a ceramic dielectric material for prohibiting arc discharge, such as alumina, is coated on both sides or one side of upper and lower electrodes disposed with an adequate gap therebetween, and high AC pulse voltage is applied to generate an atmospheric pressure plasma.

A remote plasma type using dielectric material barriers is a low-temperature plasma shower type enabling a large area. However, the remote plasma type (Y. Sawada, K. Nakamura, H. Kitamura, Y. Inoue, "Plasma treatment apparatus and plasma treatment method performed by use of the same apparatus", U.S. Pat. No. 6,424,091 (Jul. 23, 2002)) has a structure in which it can be inevitably used limitedly since the plasma density is low due to the control of the dielectric material, and has lots of energy loss and generation of great heat due to a dielectric material discharge, requiring cooling. Thus, the remote plasma type is difficult for maintenance.

SUMMARY OF THE INVENTION

Accordingly, the present invention has been made in an effort to solve the above problems occurring in the prior art, and an object of the present invention is to provide an induction concentration remote atmospheric pressure plasma generating apparatus in which a high-density plasma can be locally generated in an important region while not generating arc in a multi-cell including induction electrodes and discharge electrodes, large area processing efficiency can be increased by irradiating the high-density plasma to a sample, so that generation of a plasma can be minimized in an unnecessary space to increase energy efficiency, and difficulty in cooling due to the existing water cooling can be solved since generation of heat is low.

To accomplish the above objects of the present invention, according to the present invention, there is provided an induction concentration remote atmospheric pressure plasma generating apparatus comprising, a hot electrode having one or more holes; induction electrodes disposed within the hot electrode holes, wherein the hot electrode holes and the induction electrodes are spaced apart from each other at predetermined intervals; a dielectric material surrounding the hot electrode and the induction electrodes, wherein the induction electrodes are projected downwardly from the dielectric material; a spring disposed below the induction electrodes; a discharge electrode disposed below the spring, wherein a lower side of the induction electrode, the spring and the discharge electrodes are located within a discharge electrode holding hole of a ceramic dielectric material having a narrow discharge hole; a ground electrode having a small hole and disposed below the narrow discharge hole of the ceramic dielectric material, the ground electrode being grounded; and a chamber for accommodating the above constituent elements and having a working gas supply unit for supplying a working gas.

According to the aspect of the present invention, there is a provide an induction concentration remote atmospheric pressure plasma generating apparatus including; wherein a sample is disposed under the ground electrode.

According to the aspect of the present invention, there is a provide an induction concentration remote atmospheric pressure plasma generating apparatus including; wherein high AC voltage is applied to the hot electrode and the ground electrode in order to generate a plasma.

BRIEF DESCRIPTION OF THE DRAWINGS

Further objects and advantages of the invention can be more fully understood from the following detailed description taken in conjunction with the accompanying drawings in which:

The FIGURE is a view illustrating an induction concentration remote atmospheric pressure plasma generating apparatus according to an embodiment of the present invention.

DETAILED DESCRIPTION OF THE PREFERRED EMBODIMENT

Figure 1:
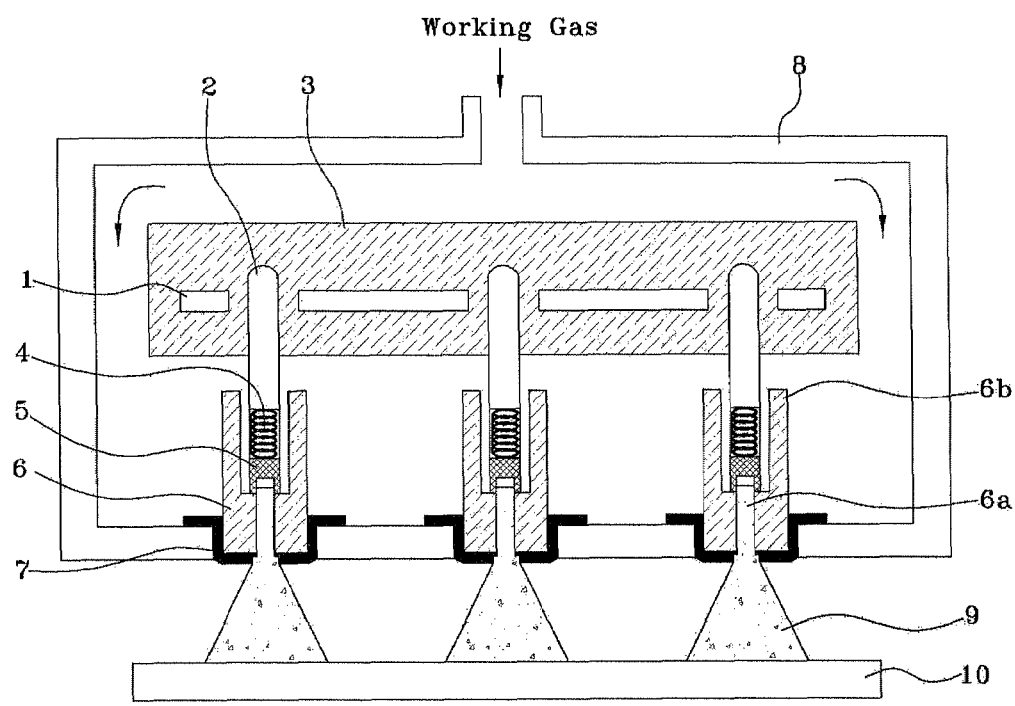

The present invention will now be described in detail in connection with a specific embodiment with reference to the accompanying drawings.

The FIGURE is a view illustrating an induction concentration remote atmospheric pressure plasma generating apparatus according to an embodiment of the present invention.

The induction concentration remote atmospheric pressure plasma generating apparatus of the present invention is described with reference to the drawing. As illustrated in the FIGURE, a hot electrode 1 has one or more holes. An induction electrode 2 is disposed within the hot electrode hole. The hot electrode hole and the induction electrode 2 are spaced apart from each other at a predetermined interval. The hot electrode 1 and the induction electrode 2 are surrounded by a dielectric material 3. The induction electrode 2 is projected downwardly from the dielectric material 3. A spring 4 is disposed below the induction electrode 2. A discharge electrode 5 is disposed below the spring 4. The lower side of the induction electrode 2, the spring 4 and the discharge electrodes 5 are located within a discharge electrode holding hole 6b of a ceramic dielectric material 6 having a narrow discharge hole 6a. A ground electrode 7 having a small hole is disposed below the narrow discharge hole 6a of the ceramic dielectric material 6. The ground electrode 7 is grounded. A chamber 8 accommodates the constituent elements, and has a working gas supply unit for supplying a working gas. The working gas is spouted from the ground electrode 7 having the small hole through the discharge electrode holding hole 6b to the narrow discharge hole 6a. A sample 10 is disposed under the ground electrode 7.

The FIGURE, a plasma is generated as follows. A high-density plasma is generated between the discharge electrode 5 and the ground electrode 7 in the narrow discharge hole 6a of the ceramic dielectric material 6 by means of an inter-metal discharge. The generated high-density plasma is spouted downwardly by means of the velocity of the working gas of high voltage. The generated plasma is a remote plasma, and can be processed without damage to the substrates of semiconductors or display panels. The present invention can generate a high-density plasma through such inter-metal discharge, which cannot be obtained due to the breakage of a dielectric material, etc. in the existing DBD method.

A phenomenon in which a plasma is generated is described below with reference to the FIGURE. If high AC voltage is applied to the hot electrodes 1 and the ground electrode 7, the induction electrode 2 is electrified by means of the dielectric material 3 existing between the hot electrode 1 and the induction electrode 2, and thus becomes a high potential state. The high potential of the induction electrode 2 causes the discharge electrode 5 to have a high potential through the spring 4.

A high-density plasma is generated in the narrow discharge hole 6a of the ceramic dielectric material 6 due to a high potential difference between the discharge electrode 5 and the ground electrode 7.

The generated high-density plasma is spouted to the surface of the sample by means of the velocity of the working gas of high voltage. As mentioned above, the dielectric material 3 serves as a capacitor and the ceramic dielectric material 6 serves as a resistor in a plasma discharge within the narrow discharge hole 6a, producing RC resonance and thus minimizing energy loss.

The current of the generated plasma is controlled by means of the dielectric material 3, so that the plasma is not transferred as heat arc. The intensity of the generated plasma is proportional to the thickness of the hot electrode, and is in inverse proportion to the distance between the induction electrode 2 and the hot electrode 1. Thus, corona, normal glow, abnormal glow, non-thermal arc plasma states can be easily controlled by controlling the thickness and distance or input power.

The above discharge mechanism will be referred to as an "Induction Concentration Remote Plasma (ICRP)" in the present invention.

The advantages obtained by using the hot electrode 1, the induction electrode 2, the dielectric material 3, the discharge electrode 5, the ceramic dielectric material 6 and the ground electrode 7 are as follows.

First, a plasma can be generated in several plasma generation cells at the same time by using one power supply device.

Second, the discharge electrode 5 and the ground electrode 7 are not broken even in a strong plasma since they are made of metal. It is therefore possible to provide the source of a strong plasma.

Third, in describing the principle in which a plasma is generated, energy loss due to the dielectric material, which is generated in the existing dielectric material barrier discharge DBD method, is low through RC resonance, and there is no need for an additional cooling device since generation of heat is low.

In comparison with the existing DBD type remote plasma generation apparatus, the induction concentration remote atmospheric pressure plasma generating apparatus shown in the FIGURE locally generates a high-density plasma in an important region. Thus, since the high-density plasma is irradiated to a sample, not only processing efficiency can be increased, but a plasma is not generated at unnecessary spaces. Accordingly, there are advantages in that energy efficiency is high, generation of heat is low, and a cooling difficulty in the existing cooling method can be solved.

In general, if high voltage is applied to several metal electrodes spaced apart from each other at predetermined distances, arc is generated between the closest electrodes and a strong electrical path is formed by a strong plasma. Thus, a very high current flows and the applied voltage is attenuated, so that a plasma cannot be generated in several metal electrodes at the same time. The present invention is an invention capable of solving the problems. The present invention is advantageous in that a high-density plasma can be generated between several metal electrodes, and corona, normal glow, abnormal glow and non-thermal arc plasma states in the generated plasma can be easily controlled through the control of input power.

In the present invention, the working gas can include all kinds of gases.

As described above, according to the induction concentration remote atmospheric pressure plasma generating apparatus in accordance with the present invention, the induction electrodes, the discharge electrodes and the ground electrode are used. Accordingly, a high-density plasma can be generated at local regions due to a discharge between he metal electrodes, and a plasma is not generated in unnecessary regions. It is therefore possible to efficiently process samples of a large area.

Further, as an antenna and an antenna electrode are used, there are advantages in that a plasma can be generated in a plasma cell including several metal discharge electrodes by using one power supply device while not generating arc between metal electrodes, a specific heat corner or glow discharge plasma in the generated plasma can be easily controlled through control of the size of the antenna size, and samples of a large area 3D structure can be efficiently processed.

Further, the substrates of semiconductor or display panels, which are electrically invulnerable, can be processed without damage by generating a remote high-density plasma.

A structure in which a high-density plasma can be generated outwardly without being restricted to space can be implemented. It is therefore possible to uniformly process samples with no regard to the size of the samples.

Furthermore, specific heat corner or glow discharge plasma in a generated plasma can be easily controlled through control of the size of an antenna.

Furthermore, there is an advantage in that a sample can be processed uniformly regardless of the size of the sample since a lower electrode is disposed under the sample such that a generated plasma can reach the surface of the sample. Further, since an upper metal electrode, an antenna and an antenna electrode are used, a plasma generating apparatus, which has high efficiency and a simple structure and can fabricate a large area at low cost, can be fabricated.

In addition, any kinds of materials, such as insulators, conductors and semiconductors, can be cleaned and surface reformed easily and stably regardless of the types of samples as well as complicated 3D samples.

While the present invention has been described with reference to the particular illustrative embodiment, it is not to be restricted by the embodiments but only by the appended claims. It is to be appreciated that those skilled in the art can change or modify the embodiments without departing from the scope and spirit of the present invention.

What is claimed is:

1. An induction concentration remote atmospheric pressure plasma generating apparatus, comprising:
    a hot electrode having one or more holes;
    induction electrodes disposed within the hot electrode holes, wherein the hot electrode holes and the induction electrodes are spaced apart from each other at predetermined intervals;
    a dielectric material surrounding the hot electrode and the induction electrodes, wherein the induction electrodes are projected downwardly from the dielectric material;
    a spring disposed below the induction electrodes;
    a discharge electrode disposed below the spring, wherein a lower side of the induction electrode, the spring and the discharge electrodes are located within a discharge electrode holding hole of a ceramic dielectric material having a narrow discharge hole;
    a ground electrode having a small hole and disposed below the narrow discharge hole of the ceramic dielectric material, the ground electrode being grounded; and
    a chamber for accommodating the above constituent elements and having a working gas supply unit for supplying a working gas.

2. The induction concentration remote atmospheric pressure plasma generating apparatus of claim 1, wherein a sample is disposed under the ground electrode.

3. The induction concentration remote atmospheric pressure plasma generating apparatus of claim 1, wherein high AC voltage is applied to the hot electrode and the ground electrode in order to generate a plasma.

* * * * *